United States Patent [19]

Weresch

[11] 4,229,964
[45] Oct. 28, 1980

[54] APPARATUS FOR TREATING LEADS OF ELECTRICAL COMPONENTS

[76] Inventor: Thomas Weresch, Greschbachstr. 19, D-7500, Karlsruhe 41, Fed. Rep. of Germany

[21] Appl. No.: 18,917

[22] Filed: Mar. 9, 1979

[30] Foreign Application Priority Data

Mar. 11, 1978 [DE] Fed. Rep. of Germany ....... 2810654

[51] Int. Cl.³ .......................... B21J 9/18; B23P 23/00
[52] U.S. Cl. ........................................ 72/452; 72/191; 72/DIG. 10; 140/105
[58] Field of Search ................. 29/33 M, 33 F, 566.3, 29/564.8, 741; 140/1, 105, 106; 72/190, 191, 452, 406, DIG. 10

[56] References Cited

U.S. PATENT DOCUMENTS

| 4,003,413 | 1/1977 | Hanson et al. | 140/1 |
| 4,108,217 | 8/1978 | Westberg | 140/105 |

*Primary Examiner*—Carl E. Hall
*Attorney, Agent, or Firm*—Craig & Antonelli

[57] ABSTRACT

Apparatus for preparing leads of electrical components, such as transistors or the like, having a carrier plate rotatable about a fixed axis of rotation, at least one tool set arranged at the periphery of the carrier plate, said tool set including a stationary tool and a tool pivotable about a pivot axis that is parallel to the fixed axis of rotation, and a fixed cam disk. The pivotable tool, during rotation of the carrier plate, is controlled by an operating cam section of the fixed cam disk so as to move from an open position into a closed position, and the cam disk has a further, opening cam, section for controlling the pivotable tool so as to move from the closed position into the open position.

10 Claims, 8 Drawing Figures

APPARATUS FOR TREATING LEADS OF ELECTRICAL COMPONENTS

BACKGROUND AND SUMMARY OF THE INVENTION

The invention relates to an apparatus for treating the leads of electrical components, such as transistors or the like, with a carrier plate rotatable about a fixed axis of rotation having at least one tool set arranged at the periphery of the carrier plate consisting of a stationary tool and a tool pivotable about a pivot axis in parallel to the axis of rotation, wherein the pivotable tool, during the rotation of the carrier plate, is controllable by an operating cam section of a fixed cam disk from an open position into a closed position (applicant's U.S. Patent Application Ser. No. 888,146, filed Mar. 20, 1978). In this connection, a pivotably mounted ejector lever can furthermore be provided.

The invention is especially directed toward the preparation of the leads of transistors, but basically relates to all components wherein the leads are likewise arranged only on one side of the body of the component. The treatment to which these leads are subjected involves primarily bending, crimping, and cutting to length, i.e. measures by which the transistors are prepared for insertion in a circuit board. In this process, according to my U.S. Ser. No. 888,146 with respect to which the present application represents an improvement, the components are fed from a storage container, which is fashioned, for example, as a vibrating pot, via a conveying means in close succession to the tools. The conveying means has a transfer slot at the point at which the components are transferred to the tools, this slot being arranged approximately at the level of the tools and extending in the peripheral direction of the tools, and furthermore being open in this direction. Respectively, one component is disposed in this slot with leads extending downwardly through this slot. During the revolution of the carrier plate, respectively one component is seized, in the open position of the tools of a tool set, by the fixed tool trailing in the peripheral direction and thereafter, upon controlling the pivotable tool so that is assumes its closed position, is clamped between the tools and treated.

After the treatment, during the transition into the open position, the thus-prepared components must be ejected from the tools. For this purpose, an ejector lever is provided, pivotably arranged at the fixed tool and/or at the carrier of this tool, this lever being pulled by a spring into a rest position not impeding the tools and being pivotable outwardly by means of a stationary stop.

This apparatus, which is the subject matter of my abovenoted application, has proven itself excellently, per se. However, certain problems arose when the peripheral speed of the carrier plate was increased to enhance the operating efficiency. According to the suggestion advanced by myself in Ser. No. 888,146, the pivotable tool as well as the ejector lever are positively actuated only in one direction, namely toward the closed position and/or toward the ejection position. The resetting in the opposite direction, i.e. into the open position of the tools and/or the rest position of the ejector level, in contrast thereto, is effected by spring force. If the springs provided for this purpose do not have a sufficiently strong design, then an accurate chronological control of the operating cycle is no longer ensured at higher operating speeds. On the other hand, if these springs are made to be sufficiently strong, then considerable forces must be expended during the operation of tools and ejector lever, leading accordingly to undesirably high stresses on the material and considerable noise generation.

Therefore, an object of the invention is to provide an apparatus which cures the problem described hereinabove so that higher operating velocities can be attained without undue stresses on the material and with minimum noise generation.

This problem has been solved, in accordance with a preferred embodiment according to the invention, in that the cam disk is additionally provided with an opening cam section, and that the pivotable tool can be operated by the opening cam section to assume, from the closing position, the opening position. Thus, the preferred embodiment realizes a positive control of the pivotable tool, which entirely eliminates a spring for returning the pivotable tool into the open position. Since, consequently, only inertial forces rather than spring forces need to be overcome when changing from the open position into the closed position, as well as vice versa, the possibility is obtained to exert an exact control of the chronological cycle even at high rotational speeds, wherein the occurring accelerations can be maintained within the permissible limits by an appropriate design of the operating cam section and the opening cam section.

Preferably, respectively one scanning roller (closing roller and opening roller) is associated with the operating cam section and the opening cam section, these rollers being connected to the pivotable tool. The scanning rollers are mountable directly to the tool, but they are preferably arranged at the appropriate tool holder. In any event, this arrangement makes it possible to effect a separate adjustment for the opening step and the closing step. The operating cam section must expend not only inertial forces to accelerate the pivotal tool, but above all, also the treatment forces. Accordingly, the operating cam is designed to be strong and is customarily machined "from a solid piece."

The opening cam section, however, need merely provide inertial forces and thus can be made to be less rugged. Thus, there is the possibility of forming the opening cam section by a sheet-metal strip attached to the periphery of the cam disk; in this way, an apparatus according to my above-noted application can be modified in a simple way.

Furthermore, it is contemplated within the scope of the present invention to arrange the scanning rollers coaxially to each other and accordingly disposing the operating cam section and the closing cam section offset with respect to each other in the direction of the axis of rotation. An independent synchronization of the opening and closing operations can be effected by an appropriate selection of the diameters of the scanning rollers.

The above-discussed problems are encountered to a particularly great extent in connection with the ejection of the components, which have been treated, during the opening of the tools. At higher operating velocities, the ejection does not take place in a reliable fashion, which can lead to considerable disturbances in the operating cycle.

In this respect the invention teaches an especially advantageous embodiment, which is characterized by a carrier arm connected to the pivotable tool—or to the tool carrier itself—and being in engagement with the ejector level. By the carrier arm, the adjustment of the pivotable tool is also utilized for operating the ejector level. The connection of the carrier arm with the pivotable tool proves to be much less expensive than a direct cam disk control of the ejector lever. At the same time, the possibility is attained of providing an exact and unequivocal temporal synchronism between the opening of the tools and the ejection of the components. In this connection, the ejection takes place perforce from the opening cam section side and thus at maximum reliability.

Considering the manufacturing tolerances, it is advantageous to design the engagement of the carrier arm at the ejector lever so that it has at least a certain amount of play or can be effected at all merely in the opening direction, while the ejector lever—as described in Ser. No. 888,146—is pulled in the opposite direction by spring force. Such an engagement can be attained, for example, by providing that the carrier arm extends with a claw behind a projection and/or pin at the ejector lever, or that the carrier arm engages with a pin into a slotted hole of the ejector lever. Furthermore, the carrier arm can be rigidly joined to the pivotable tool and/or its tool carrier, or it can be pivotally attached thereto and maintained in engagement by means of spring force.

It is expedient to mount the ejector lever to be pivotable about an axis in parallel to the axis of rotation, namely preferably directly to the fixed tool, so that a compact module results.

The respective treatment to be conducted may make it necessary to provide the tools with several so-called combs [serrated elements] which cooperate in pairs during the closing step. Independently of the objective of the treatment, this feature is also advantageous with a view toward a precise guidance of the components during ejection, and in this connection the invention teaches to provide at least two of such combs and to arrange the ejector lever between the combs of the fixed tool. In this connection, the advantageous possibility is obtained, in particular, of fashioning the ejector lever proper as a comb and thus use same during the treatment, for example, for the crimping or bending of the leads. The ejector lever is, in any event, disposed in parallel to the combs, which latter constitute more or less planar structures, and is nestled between these combs, which results in a secure and non-tilting engagement at the leads of the components.

In another advantageous embodiment, the ejector lever has two mutually parallel ejector arms joined together by a connecting web with the formation of a U-shaped cross section and enclosing between them one of the combs of the fixed tool. In this arrangement, an extra-ordinarily compact structure results ensuring an extensively straight and thus troublefree ejection of the components. Preferably, the ejector arms enclose between them the uppermost of the combs of the fixed tool, so that the lower one of the ejector arms engages the leads and the upper one engages the housing of the components. In the embodiment described in the above noted application with tension relief of the leads during the treatment by means of a holder and counter holder [bracket], it is especially advantageous to provide an arrangement wherein the ejector arms enclose between them the counter holder associated with the fixed tool and preferably also the uppermost comb of the fixed tool.

These and further objects, features and advantages of the present invention will become more obvious from the following description when taken in connection with the accompanying drawings which show, for purposes of illustration only, several embodiments in accordance with the present invention.

DETAILED DESCRIPTION OF THE PREFERRED EMBODIMENT

Figure 1:
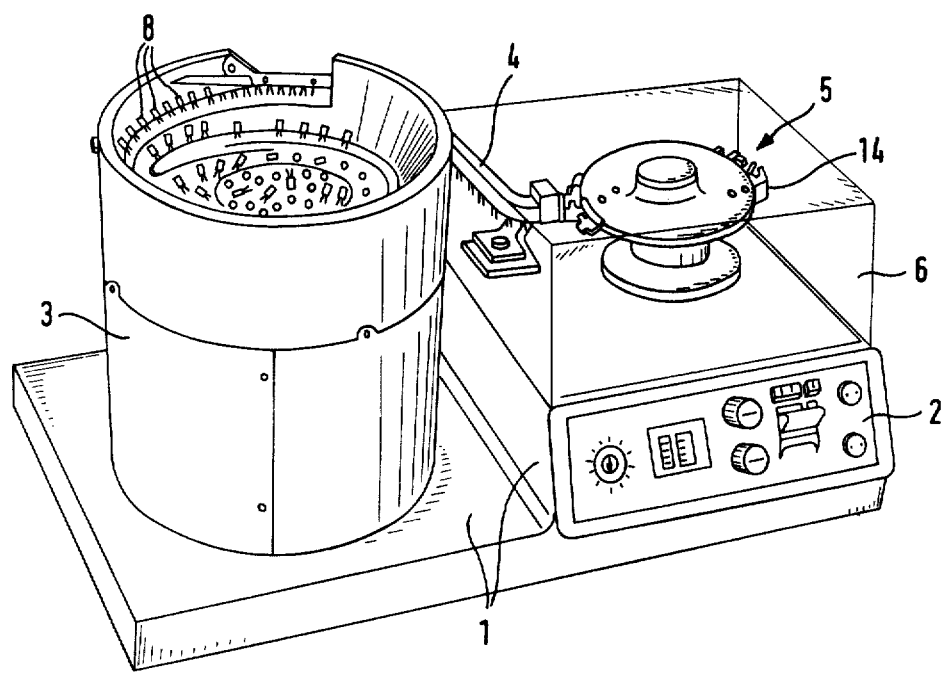
FIG. 1 shows an apparatus for bending, crimping, and cutting to length leads of transistors, in a perspective view.

The apparatus illustrated in FIG. 1 consists in its basic structure of a housing 1 with a control console 2, a storage container in the form of a vibrating pot 3, a conveying means 4 connected thereto, and a tool carrier 5 which, in the embodiment illustrated, is covered by a transparent hood 6, through which the conveying means 4 is extended. An electric motor and optionally a gear system for the drive mechanism of the tool carrier 5 are accommodated in the housing 1.

The apparatus serves for the bending, crimping, and cutting to length of the leads of transistors during the course of preparing same for insertion in circuit boards or the like. For this purpose, the transistors 8 are conveyed from the vibrating pot 3 via the conveying means 4 to the tool carrier 5. The conveying means 4 consists essentially of a closed duct, the bottom wall of which has a slot. The transistors 8 are arranged with their housing 9 in the interior of the cut and are fed in close succession to the tool carrier 5, the leads 10 of the transistors 8 projecting downwardly out of the slot of the conveying means 4.

The tool carrier 5 consists essentially of a carrier plate 11 several tool sets 14—two being shown in the illustrated embodiment—are provided, each of which consists essentially of a fixed tool 15 and a pivotable tool 16. The pivotable tools 16 are each pivotable about a pivot axis 17 in parallel to the axis of rotation 12.

Figure 2:
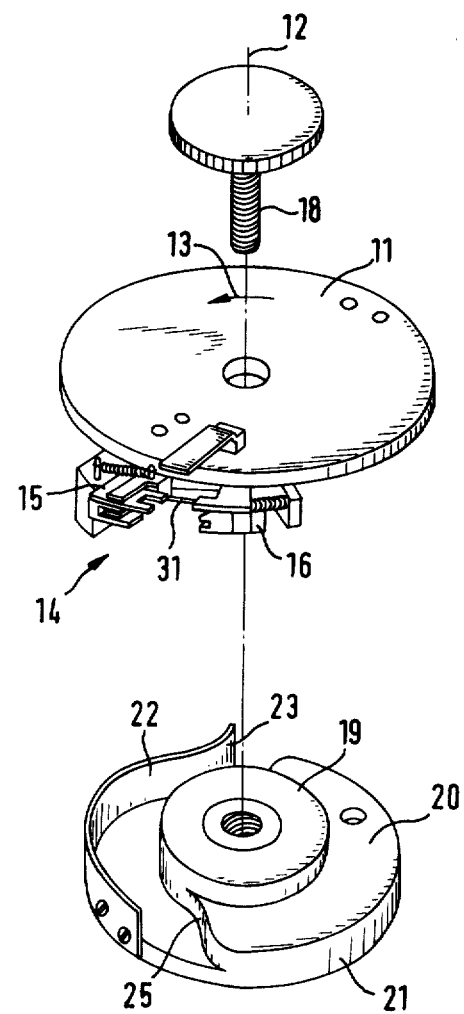
FIG. 2 shows an exploded view of a cam disk and carrier plate.

As can be seen from the exploded view shown in FIG. 2, the carrier plate 11 is attached with a knurled-head screw 18 to a flange 19 of a drive shaft (not shown). A cam disk 20 is fixedly arranged coaxially thereto, this cam disk controlling the pivotable tools 16 during the rotation of the carrier plate 11 from the open position into the closed position and vice versa. For this purpose, the cam disk 20 has, a first of all, an operating cam section 21 which maintains the pivotable tools 16 in the closed position by way of scanning roller (omitted from FIG. 2, but shown in FIG. 3).

Figure 3:
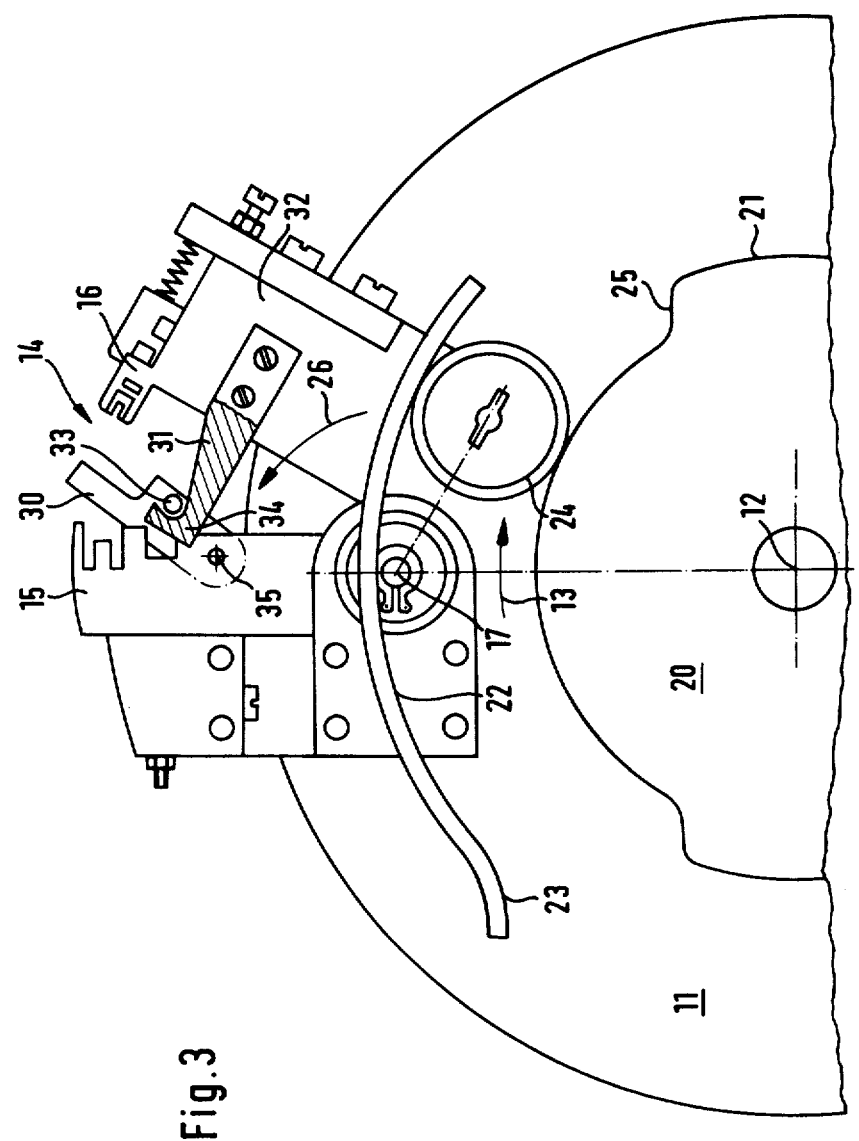
FIG. 3 shows the carrier plate with a tool set in the open position in a bottom view.

As further shown in FIG. 2, the cam disk 20 has an opening cam section 22 fashioned as a sheet-metal strip of a suitable thickness attached by means of screws or the like to the periphery of the cam disk 20. A lead-in section 23 is formed at the forward portion of the opening cam section 22 as seen in the rotating direction 13, by means of which the scanning roller is positively guided from the relatively large radius of the operating curve section 21 to the smaller radius of the opening cam section, entraining during this step the associated pivotable tool 16 into the open position. These relationships can be more clearly seen in FIG. 3, wherein a bottom view of the carrier plate 11 with a tool set 14 and the cam sections 21, 22 are shown. The FIG. 3 representation is schematic insofar as the structural connection of the operating cam section 21 and the opening cam section 22 by the cam disk 20 is not illustrated. It can clearly be seen how, during the entrance of the scanning roller 24 in the direction of rotation 13, the roller, which is connected to the pivotable tool 16, is guided to a smaller radius by the lead-in section 23, so that the pivotable tool 16 is pivoted about the pivot axis 17 into the open position. At the end of the opening cam section 22, the scanning roller 24 encounters the rise 25 toward the operating cam section 21, wherein the pivotable tool 16 is returned, in the direction of arrow 26, to the closed position.

At the transfer point (not shown) to the tools 15, 16, the conveying means 4 has a transfer slot (likewise not shown) arranged approximately at the level of the tools 15, 16, extending in the peripheral direction 13, and being open in this direction. The transfer slot accommodates the component which is respectively the next one to be treated. The tools 15, 16 are controlled so that they move past the transfer slot in the open position during the revolution of the carrier plate 11. During this step, the component disposed in this slot is seized by the fixed tool 15 trailing in the direction of rotation 13 and thereafter, during the further rotation of the carrier plate, clamped in between the closing tools and treated. The details in connection with the tools need not be described in any detail herein, since these are disclosed in my application Ser. No. 888,146, which is incorporated herein by reference to the extent necessary to complete an understanding of this invention.

As shown in FIG. 3, an ejector lever 30 is provided which ejects the components 8 from the fixed tool 15, once the pivotable tool 16 has been returned into its open position after the treating step. This open position is shown in FIG. 3. The ejector lever is actuated by a carrier arm 31 fixedly joined to the tool carrier 32 of the pivotable tool 16 and extending with a claw 34 behind a pin 33 provided at the ejector lever 30. The ejector lever 30 is mounted at the fixed tool 15 and is pivotable about a pivot axis 35 in parallel to the axis of rotation 12. This arrangement causes the ejector lever 30 to be positively activated during the opening of the tools 15, 16.

Figure 4:
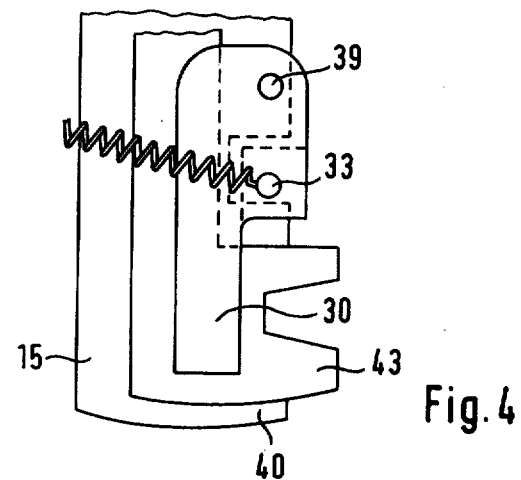
FIG. 4 shows a fixed tool with ejector lever in a plan view.
Figure 5:
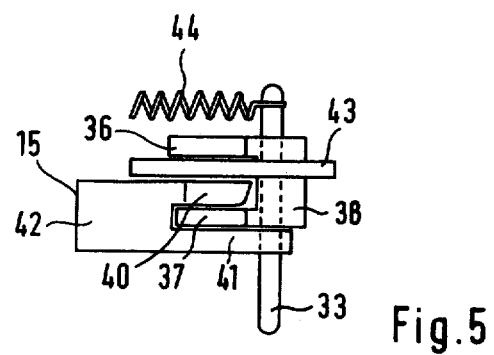
FIG. 5 shows the structure of FIG. 4 in a front view.

Additional details can be seen from FIGS. 4 and 5. It can be seen that the fixed tool 15 is provided with two so-called combs 40, 41 for treating the leads, these combs representing essentially planar structures. The combs are arranged in parallel to each other and are joined on the rear sides by a tool member 42. The drawing does not show that these comb structures can be mutually displaced in a direction with the arrangement of the leads. Furthermore, corresponding combs (not shown) are provided at the associated pivotable tool 16 these combs being in correspondence with the combs of the fixed tool 15 shown in FIGS. 4 and 5. Also, a counter holder 43 is shown in FIGS. 4 and 5 which can be adjusted in the closing direction with respect to the fixed tool 15 against the force of a spring. In a manner explained in detail in my above-reference earlier application, this counter holder, together with a corresponding holder arranged at the pivotable tool 16, ensures a tension relief of the leads during the treatment step.

The ejector lever 30 has two mutually parallel ejector arms 36, 37 joined by a connecting web 38, so that the ejector lever 30 has a U-shaped structure along part of its length. To support the ejector lever 30 at the fixed tool 15, a pin 39 is provided which penetrates the ejector lever 30 in its rear section and also passes through the fixed tool 15. The ejector lever 30 is furthermore penetrated by the pin 33 which, in turn, serves for the engagement of the claw 34 (see FIG. 3) and which is engaged, on the other hand, by a spring 44, the latter retracting the ejector lever 30 into its rest position shown in FIGS. 4 and 5. The lower ejector arm 37 is arranged between the two combs 40, 41 of the fixed tool 15 and at the same time the two ejector arms 36, 37 enclose between them the upper comb 40 of the fixed tool 15 as well as the counter holder 43. In this arrangement, the lower ejector arm 37 contacts the tool body 42 in the rest position and thus is usable simultaneously as part of the fixed tool 15 during the treatment of the leads.

Figure 6A:
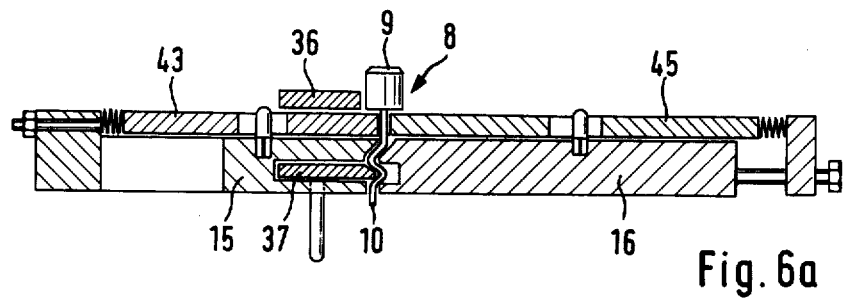
FIGS. 6a–c show various operating positions of the tools and of the ejector lever in a simplified illustration in a sectional view.
Figure 6B:
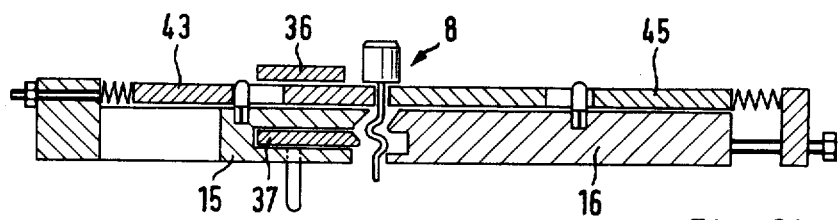
Figure 6C:
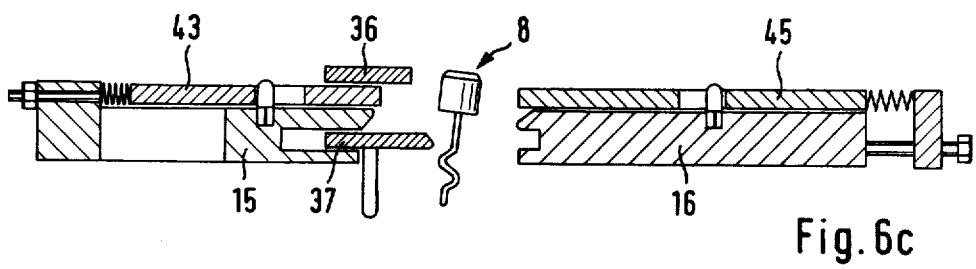

FIGS. 6a–c show in a simplified representation, three motion phases of the tool and ejector lever. In the position according to FIG. 6a, the bending and crimping of the leads 10 of a transistor 8 is being completed; the leads 10 are clamped, to afford tension relief, between the counter holder 43 and the holder 45, and the fixed tool 15 and the pivotable tool 16 are in the closed position. FIG. 6b shows the beginning of the opening phase, wherein the tools 15, 16 are already moving away from each other, while the leads 10 are still clamped between the counter holder 43 and the holder 45. The ejector arms 36, 37 are still in their rest position. With the opening movement continuing, the counter holder 43 and the holder 45 also move away from each other, the counter holder 43 following to a limited extent the opening motion due to its spring bias. A reliable ejection of the transistor 8, however, cannot be attained thereby.

FIG. 6c, finally, shows the tools 15, 16 in the fully open position with the ejector lever 30 pivoted outwardly. In this phase, the upper ejector arm 36 engages the housing 9 of the transistor 8, while the lower ejector arm 37 engages the leads 10. Consequently, the transistor 8 is ejected reliably and effectively from the fixed tool 15. It is to be noted that corresponding measures are not necessary for the pivotable tool 16, since the latter, in contrast to the fixed tool, does not have any shaping recesses of great depth. Under practical conditions, the tools 15, 16 can customarily be designed so that deep shaping recesses, which require special measures for the ejection of the components after the treatment, are provided only in one of the two tools, which one tool can be arranged as the fixed tool. Besides, a person skilled in the art can readily see that the aforedescribed arrangement and actuation of the ejector lever 30 can also be reversed kinematically. If necessary, the ejector lever 30 can also be arranged at the pivotable tool 16, can be pivoted with the latter, and can be actuated by a carrier arm connected to the fixed tool.

While I have shown and described various embodiments in accordance with the present invention, it is understood that the same is not limited thereto but is susceptible of numerous changes and modifications as known to those skilled in the art and I therefore do not wish to be limited to the details shown and described herein but intend to cover all such changes and modifications as are encompassed by the scope of the appended claims.

I claim:

1. Apparatus for the preparation of leads of electrical components, such as transistors or the like, having a carrier plate rotatable about a fixed axis of rotation, at least one tool set arranged at the periphery of the carrier plate, said tool set including a stationary tool and a tool pivotable about a pivot axis that is parallel to the fixed axis of rotation, and a fixed cam disk, wherein the pivotable tool, during the rotation of the carrier plate, is controllable by an operating cam section of the fixed cam disk from an open position into a closed position and wherein the cam disk additionally has an opening cam section, the pivotable tool being controlled by means of the opening cam section from the closed position into the open position.

2. Apparatus according to claim 1, further comprising a separate scanning roller connected to the pivotable tool and positioned for being controlled by the operating cam section and the opening cam section.

3. Apparatus according to claims 1 or 2 comprising a pivotably arranged ejector lever, a carrier arm being connected to the pivotable tool and being arranged to actuate the ejector lever.

4. Apparatus according to claim 3, wherein the ejector lever is pivotably mounted for movement about a pivot axis extending in parallel to the axis of rotation.

5. Apparatus according to claim 4, wherein the tools each have at least two combs which cooperate in pairs when the tool set is closed; and wherein the ejector lever is arranged between the combs of the fixed tool.

6. Apparatus according to claim 5, wherein the ejector lever has two mutually parallel ejector arms, which latter are joined together by a connecting web so as to form a U-shaped cross section and enclose between them one of the combs of the fixed tool.

7. Apparatus according to claim 6, wherein the ejector arms enclose between them the uppermost of the combs of the fixed tool.

8. Apparatus according to claim 7, comprising means for providing tension relief for the leads including a holder and counter holder, and wherein the ejector arms enclose between them the counter holder, said counter holder being associated with the fixed tool.

9. Apparatus according to claim 3, wherein the ejector lever has two mutually parallel ejector arms, which latter are joined together by a connecting web so as to form a U-shaped cross section and enclose between them one of the combs of the fixed tool.

10. Apparatus according to claim 9, comprising means for providing tension relief for the leads including a holder and counter holder, and wherein the ejector arms enclose between them the counter holder, said counter holder being associated with the fixed tool.

* * * * *